(12) United States Patent
Kim et al.

(10) Patent No.: US 7,505,353 B2
(45) Date of Patent: Mar. 17, 2009

(54) MULTI-PORT SEMICONDUCTOR MEMORY DEVICE HAVING VARIABLE ACCESS PATHS AND METHOD

(75) Inventors: Nam-Jong Kim, Gyeonggi-do (KR); Ho-Cheol Lee, Gyeonggi-do (KR); Kyoung-Hwan Kwon, Seoul (KR); Hyong-Ryol Hwang, Seoul (KR); Hyo-Joo Ahn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 36 days.

(21) Appl. No.: 11/466,389

(22) Filed: Aug. 22, 2006

(65) Prior Publication Data

US 2007/0147162 A1 Jun. 28, 2007

(30) Foreign Application Priority Data

Dec. 22, 2005 (KR) .................... 10-2005-0127534

(51) Int. Cl.
*G11C 8/00* (2006.01)
*G11C 8/12* (2006.01)
*G11C 8/16* (2006.01)
*G11C 7/10* (2006.01)

(52) U.S. Cl. .................. 365/230.05; 365/230.03; 365/230.02; 365/189.02

(58) Field of Classification Search ............ 365/189.02, 365/189.03, 201, 230.02, 230.03, 230.05; 711/102, 104

See application file for complete search history.

(56) References Cited

U.S. PATENT DOCUMENTS

| | | | | |
|---|---|---|---|---|
| 4,796,232 A * | 1/1989 | House | .................. | 365/189.03 |
| 4,967,398 A * | 10/1990 | Jamoua et al. | ......... | 365/230.05 |
| 5,239,509 A * | 8/1993 | Ikawa et al. | ................. | 365/201 |
| 5,276,842 A * | 1/1994 | Sugita | ........................ | 711/149 |
| 5,335,199 A * | 8/1994 | Aoyama | ................ | 365/230.05 |
| 5,502,683 A * | 3/1996 | Marchioro | ............. | 365/230.05 |
| 5,659,711 A | 8/1997 | Sugita | | |
| 5,768,211 A * | 6/1998 | Jones et al. | ............ | 365/230.05 |
| 5,815,456 A | 9/1998 | Rao | | |
| 6,310,818 B1 * | 10/2001 | Mukai | ................... | 365/230.05 |
| 2002/0078311 A1 * | 6/2002 | Matsuzaki et al. | .......... | 711/149 |
| 2005/0111571 A1 | 5/2005 | Wang et al. | | |
| 2005/0249026 A1 * | 11/2005 | Shin | ........................... | 365/233 |
| 2007/0022245 A1 * | 1/2007 | Sohn et al. | .................. | 711/106 |

* cited by examiner

*Primary Examiner*—J. H. Hur
*Assistant Examiner*—Harry W Byrne
(74) *Attorney, Agent, or Firm*—Marger Johnson & McCollom, P.C.

(57) ABSTRACT

A multi-port semiconductor memory device having variable access paths and a method therefore are provided. The semiconductor memory device includes a plurality of input/output ports; a memory array divided into a plurality of memory areas; and a select control unit to variably control access paths between the memory areas and the input/output ports so that each memory area is accessed through at least one of the input/output ports.

7 Claims, 15 Drawing Sheets

MULTI-PORT SEMICONDUCTOR MEMORY DEVICE HAVING VARIABLE ACCESS PATHS AND METHOD

CROSS-REFERENCE TO RELATED APPLICATION

This application claims the benefit of Korean Patent Application No. 2005-127534, filed Dec. 22, 2005, the disclosure of which is hereby incorporated herein by reference in its entirety.

BACKGROUND OF THE INVENTION

1. Technical Field

The invention relates to multi-port semiconductor memory devices having variable access paths and, more particularly, to a semiconductor memory device and a method for performing a normal operation or a test operation by variably controlling access paths between a plurality of input/output ports and a plurality of memory areas.

2. Discussion of Related Art

In general, semiconductor memory devices such as random access memories (RAMs) include one port having a number of input/output pin sets in order to communicate with an external processor.

FIG. 1 illustrates a conventional semiconductor memory device having four memory banks and a single input/output port. The conventional semiconductor memory device includes a memory array 10 having four memory banks 10a, 10b, 10c and 10d, and a port control unit 20 for controlling a single input/output port. The port control unit 20 includes control circuits for controlling a command signal, an address signal, a data signal, and other signals input or output through the input/output port. All of the memory banks 10a, 10b, 10c and 10d are accessed through the port control unit 20. The arrows indicate the access paths.

The conventional semiconductor memory device having a single input/output port has problems with access speed and access efficiency. For example, to perform a first operation of storing first data in the A bank 10a and a second operation of reading second data from the B bank, which is distinct from the first operation, the semiconductor memory device must perform the operations sequentially, the first operation and then the second operation or vice versa. This is not suitable for high speed and high efficiency.

For higher speed and greater efficiency, a multi-port semiconductor memory device that performs communication through a plurality of processors and has memory cells that can be accessed through a plurality of input/output ports has been developed. An example of such a conventional multi-port semiconductor memory device is disclosed in U.S. Pat. No. 5,815,456, Sep. 29, 1998.

Generally, the conventional multi-port semiconductor memory device may have several structures to enable accessing of memory cells. Three representative structures include: (1) a structure allowing all memory cells to be accessed through any of a plurality of input/output ports; (2) a structure allowing each memory cell to be accessed only through fixed input/output ports; and (3) a structure allowing specific memory cells to be accessed only through fixed input/output ports and any remaining memory cells to be accessed through any ports.

In these structures, because access paths between the input/output ports and the memory cells are prescribed in hardware, a change among the structures is impossible. That is, a user is not allowed to change, for example, (1) the structure allowing all memory cells to be accessed through any of a plurality of input/output ports, into (2) the structure allowing each memory cell to be accessed only through fixed input/output ports. This inflexibility degrades operational efficiency of the multi-port semiconductor memory device. In addition, since a test should be separately performed through each input/output port, this inflexibility also degrades test efficiency.

SUMMARY OF THE INVENTION

One aspect of the invention is a semiconductor memory device having a plurality of input/output ports; a memory array divided into a plurality of memory areas; and a select control unit to establish variable access paths between the memory areas and the input/output ports so that each memory area is accessed through at least one of the input/output ports.

Another aspect of the invention is, in a semiconductor memory device comprising a plurality of input/output ports and a memory array divided into a plurality of memory areas, a method for variably accessing the memory areas includes allocating the memory areas for access through at least one of the input/output ports and establishing data and address paths between the memory areas and corresponding input/output ports according to the memory area allocation. The method further includes re-applying the external command signals to re-allocate the memory areas for access through different input/output ports and establishing new data and address paths between the memory areas and the different input/output ports according to the memory area re-allocation.

Yet another aspect of the invention provides a method for testing a multi-port semiconductor memory device comprising a plurality of input/output ports and a memory array divided into a plurality of memory areas, the method including: allocating the memory areas to each input/output port, so that each memory area is accessed through at least one of the input/output ports; and testing the allocated memory areas through each corresponding input/output port. The method for testing may further include re-allocating the memory areas, so that each memory area is access through different input/output ports; and testing the re-allocated memory areas through the corresponding different input/output ports.

BRIEF DESCRIPTION OF THE DRAWINGS

The above and other features and advantages of embodiments of the invention will become readily apparent by reference to the following detailed description when considered in conjunction with the accompanying drawings in which.

DETAILED DESCRIPTION OF THE INVENTION

Figure 1:
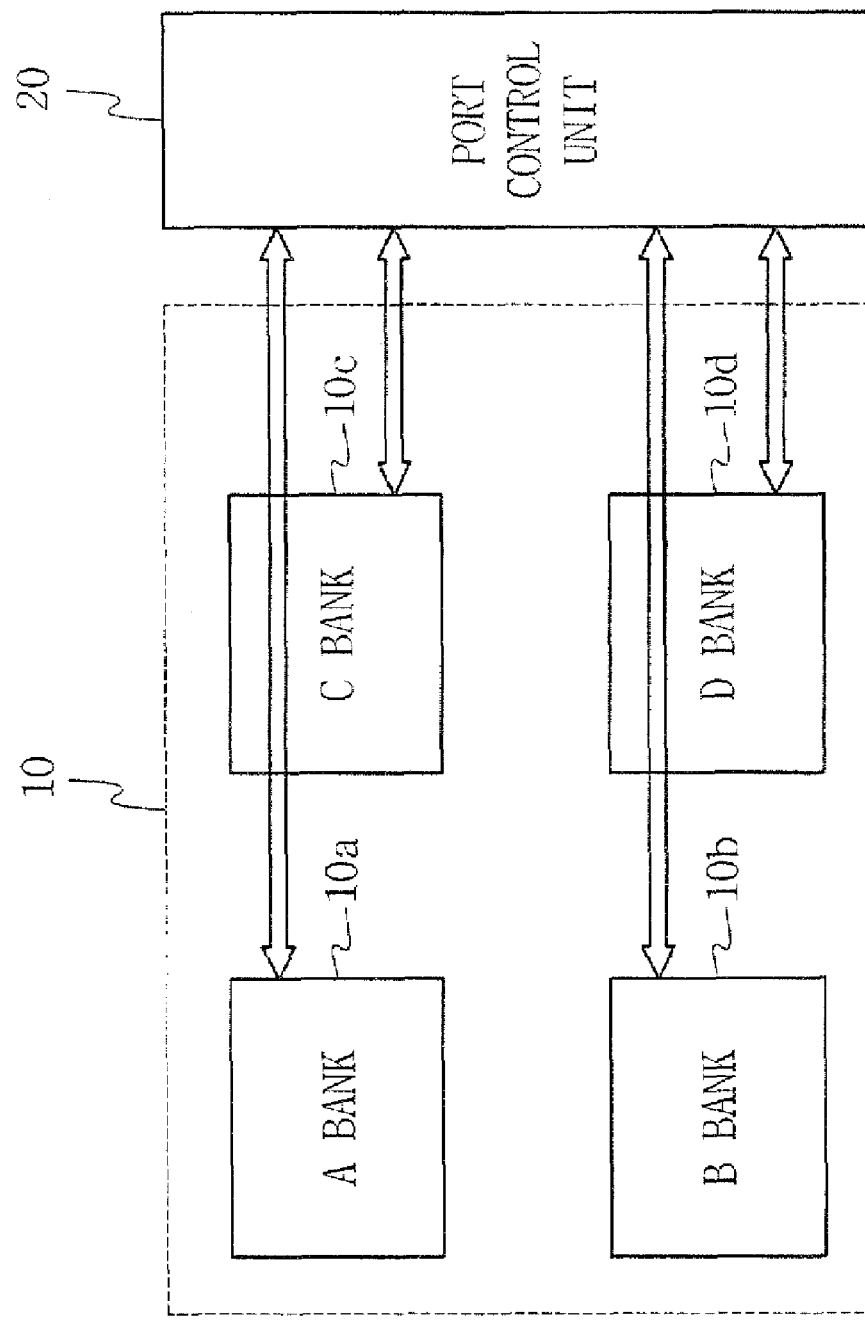
FIG. 1 illustrates access paths of a conventional semiconductor memory device having four memory banks and a single input/output port.

As will be apparent to those skilled in the art from the following disclosure, the invention as described herein may be embodied in many different forms and should not be construed as being limited to the specific embodiments set forth herein. Rather, these embodiments are provided so that this disclosure will fully convey the principles of the invention to those skilled in the art. In the drawings, the thicknesses of layers and regions are exaggerated for clarity.

For convenience of understanding, a multi-port semiconductor memory device having two input/output ports will be described. However, it will be appreciated by those skilled in the art that the invention may be applied to a multi-port semiconductor memory device having two or more input/output ports.

Figure 2:
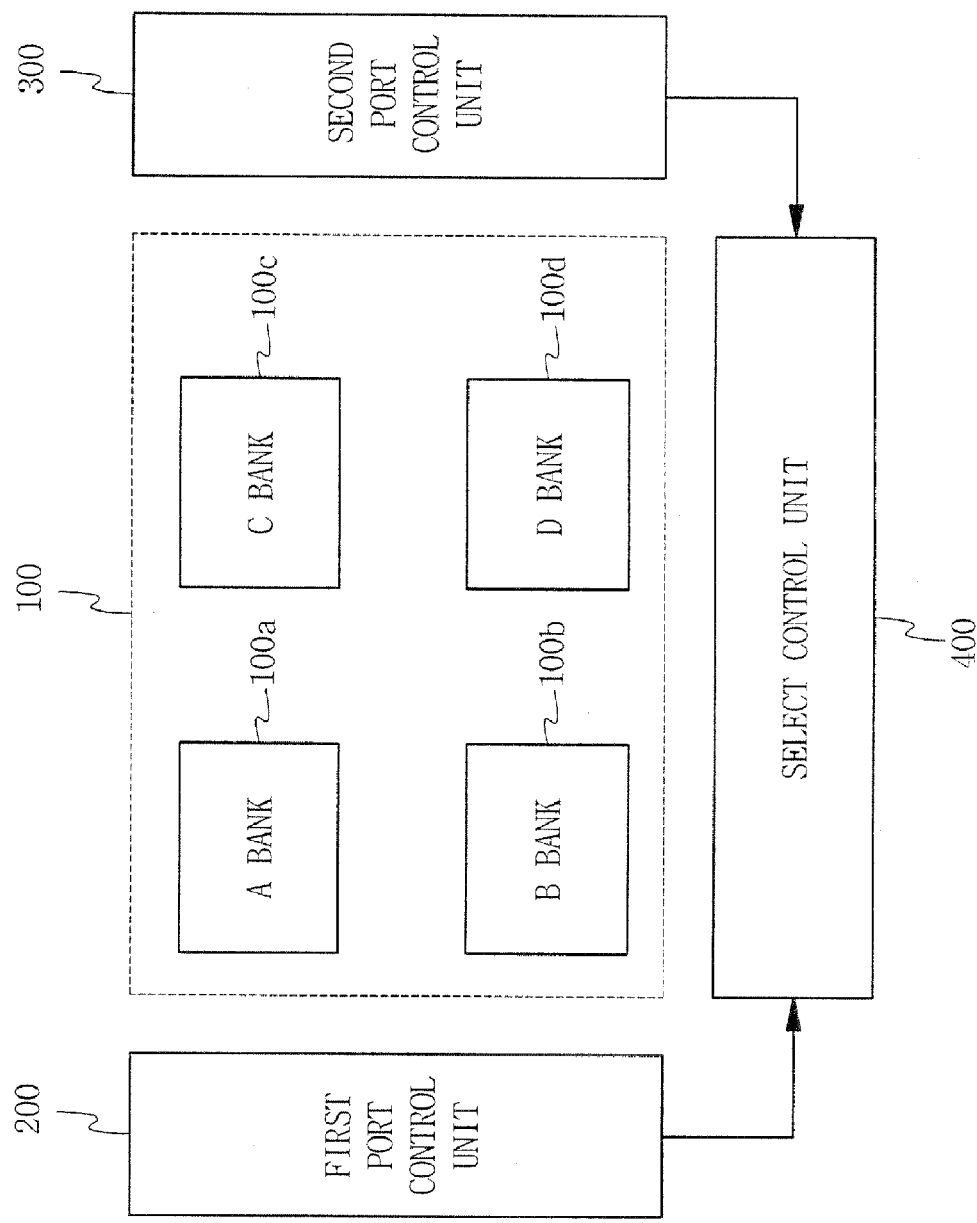
FIG. 2 is a schematic block diagram illustrating a multi-port semiconductor memory device according to an embodiment of the invention.

FIG. 2 is a schematic block diagram illustrating a multi-port semiconductor memory device according to an embodiment of the invention. The multi-port semiconductor memory device includes a memory array 100, a first port control unit 200 for controlling signals input or output through a first input/output port, a second port control unit 300 for controlling signals input or output through a second input/output port different from the first input/output port, and a select control unit 400.

The memory array 100 is divided into a plurality of different memory areas. For example, the memory array may be divided into four memory banks 100a, 100b, 100c and 100d, as in a typical semiconductor memory device.

It is to be understood that the first port control unit 200 and the second port control unit 300 include the first input/output port and the second input/output port, respectively. The first port control unit 200 includes control circuits for controlling a command signal, an address signal, a data signal, and other signals input or output through the first input/output port. Similarly, the second port control unit 300 includes control circuits for controlling a command signal, an address signal, a data signal, and other signals input or output through the second input/output port.

The select control unit 400 performs a memory allocation operation that controls a data path and an address path between the input/output ports and the memory areas constituting the memory array 100. That is, the select control unit 400 preferably controls access paths between the memory areas and the input/output ports so that each memory area may be variably accessed through at least one of the input/output ports. For example, the select control unit 400 controls the access path to variably allocate each of the four memory banks 100a, 100b, 100c and 100d as one of a first input/output port dedicated access area, a second input/output port dedicated access area, and a shared access area.

The select control unit 400 may perform a memory allocation operation in response to a mode register set (MRS) signal for a normal operation and in response to an MRS signal for a test operation. The select control unit 400 may also operate in response to a command signal generated by any external command signals normally applied for operation of the semiconductor memory device or a combination of the external command signals, which are not the MRS signal. The external command signals may be separate, independent signals that each correspond to the memory areas.

Figure 3:
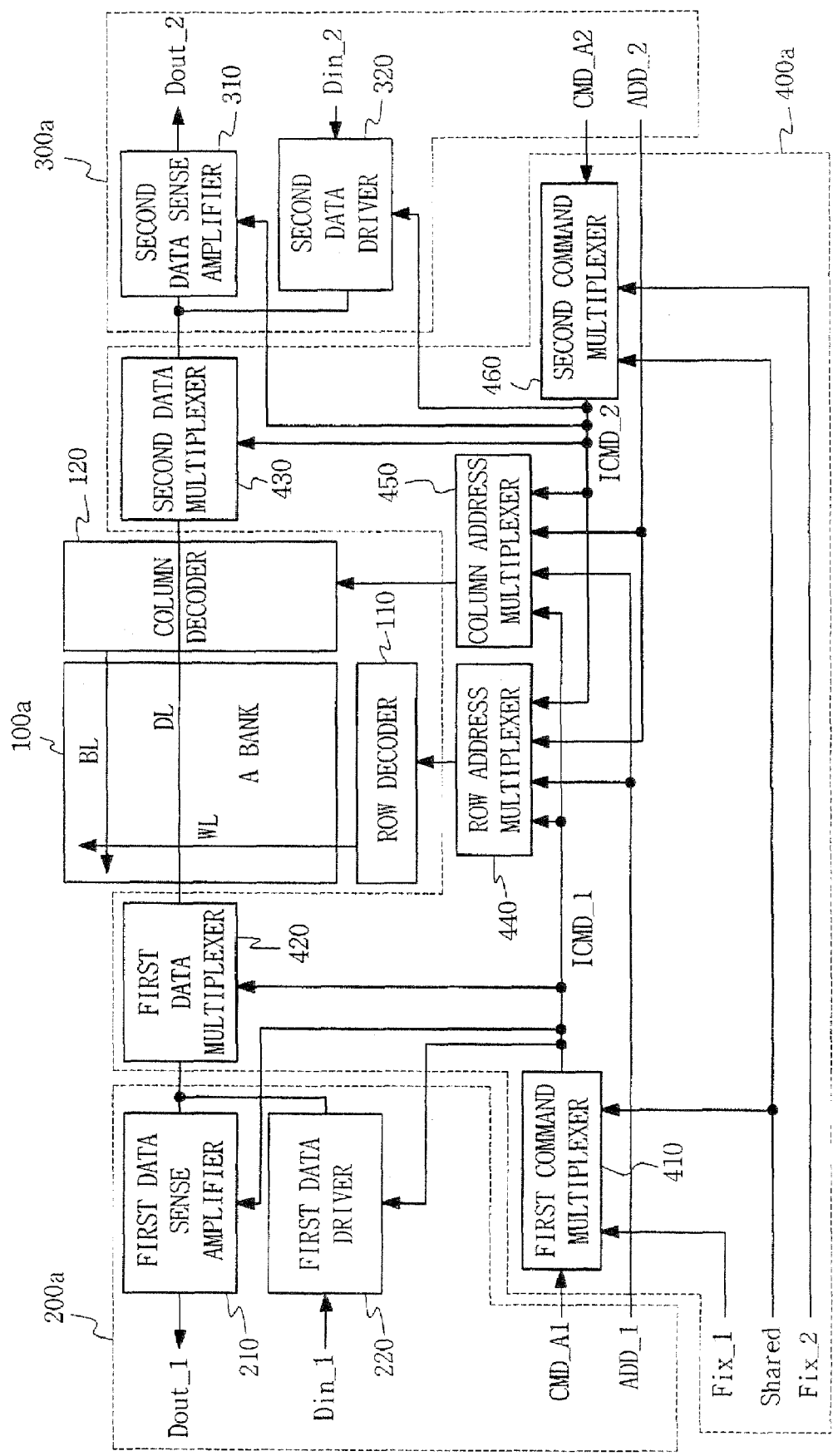
FIG. 3 is a block diagram illustrating a select control unit 400a and first and second port control units 200a and 300a for an A bank in FIG. 2.

FIG. 3 is a block diagram illustrating an example of a select control unit 400a and first and second port control units 200a and 300a for allocating one memory bank (e.g., A bank 100a) to the first or second input/output port in FIG. 2. A select control unit 400a and first and second port control units 200a and 300a shown in FIG. 3 are for only one memory bank (e.g., A bank 100a). Accordingly, as will be appreciated by those skilled in the art, if the semiconductor memory device has a plurality of memory banks, a select control unit and port control units for each memory bank may be similarly configured as the select control unit 400a and the first and second port control units 200a and 300a.

The A bank 100a in the memory array 100 of FIGS. 2 and 3 may refer to one of a plurality of memory banks in a typical semiconductor memory device. The A bank 100a may also refer to an internal sub block constituting a memory bank, which is a smaller unit than a typical memory bank. The A bank 100a may also refer to a combination of two or more memory banks.

Each memory cell in the A bank 100 is selected by one of word lines WL and one of bit lines BL. A row decoder 110 for selecting the word line WL in the A bank 100a and a column decoder 120 for selecting the bit line BL in the A bank 100a are provided around the A bank 100a.

The first port control unit 200a includes a first data sense amplifier 210 and a first data driver 220 for controlling data input to or output from the A bank through the first input/output port. The first port control unit 200a may additionally include a data buffer circuit or a latch circuit for controlling data input and output. The first port control unit 200a may further include control circuits (e.g., command buffer circuit, command latch circuit, address latch circuit, and address buffer circuit) for controlling command signals (e.g., bank select signal CMD_A1, RAS signal, CAS signal, write command signal, and read command signal) and the address signal ADD_1 input through the first input/output port. Here, the first data sense amplifier 210 is for read operation of data Dout_1 stored in the A bank 100a and outputting data Dout_1, and the first data driver 220 is for write operation of external input data Din_1 and storing data Din_1 in the A bank 100a.

The second port control unit 300a includes a second data sense amplifier 310 and a second data driver 320 for controlling data input to or output from the A bank through the second input/output port. The second port control unit 300a may additionally include a data buffer circuit or a latch circuit for controlling data input and output. The second port control unit 300a may further include control circuits (e.g., command buffer circuit, command latch circuit, address latch circuit, and address buffer circuit) for controlling command signals (e.g., bank select signal CMD_A2, RAS signal, CAS signal, write command signal, and read command signal) and the address signal ADD_2 input through the second input/output port. Here, the second data sense amplifier 310 is for read operation of data Dout_2 stored in the A bank 100a and outputting data Dout_2, and the second data driver 320 is for write operation of external input data Din_2 and storing data Din_2 in the A bank 100a.

The select control unit 400a includes a command multiplexer portion including a first command multiplexer 410 and a second command multiplexer 460, a data multiplexer portion including a first data multiplexer 420 and a second data multiplexer 430, and an address multiplexer portion including a row address multiplexer 440 and a column address multiplexer 450.

The command multiplexer portion 410 and 460 generates select control signals ICMD_1 and ICMD_2 for allocating the A bank 100a as one of a first input/output port dedicated access area, a second input/output port dedicated access area, and a shared access area. The first command multiplexer 410 generates a first select control signal ICMD_1 for the first input/output port in response to an A bank select signal CMD_A1 that is a command signal for selecting the A bank 100a, and access path control command signals Fix_1 and Shared. The first select control signal ICMD_1 controls the access path to set the A bank 100a as one of the first input/output port dedicated access area and the shared access area.

The second command multiplexer 460 generates a second select control signal ICMD_2 for the second input/output port in response to an A bank select signal CMD_A2 that is a command signal for selecting the A bank 100a, and access path control command signals Fix_2 and Shared. The second select control signal ICMD_2 controls the access path to set the A bank 100a as one of the second input/output port dedicated access area and the shared access area.

The access path to a selected memory area (e.g., the A bank 100a) is preferably determined by the access path control command signals Fix_1, Fix_2, and Shared. The command signal Fix_1 is for setting the A bank 100a as the first input/output port dedicated access area, the command signal Fix_2 is for setting the A bank 100a as the second input/output port dedicated access area, and the command signal Shared is for setting the A bank 100a as the shared access area that can be accessed at both the first and second input/output ports. For example, an input/output port used to access the A bank 100a is determined by applying one of the access path control command signals Fix_1, Fix_2, and Shared as logic 'high' and applying the remaining signals as logic 'low'. Of course, one of the access path control command signals Fix1, Fix2, and Shared may be applied as logic 'low' and the remaining signals as logic 'high'.

The access path control command signals Fix_1, Fix_2, and Shared may be input through the first input/output port or the second input/output port. Further, command signals Fix_1 and Shared may be input through the first input/output port, and the command signal Fix_2 may be input through the second input/output port.

The access path control command signals Fix_1, Fix_2, and Shared may be an MRS signal or a signal generated based on the MRS signal. Alternatively, they may be command signals generated by combining command signals normally used in the semiconductor memory device or by selecting any command signal.

The data multiplexer portion 420 and 430 controls a data path between the first and second input/output port control units 200a and 300a and the A bank 100a in response to the select control signals ICMD_1 and ICMD_2. The first data multiplexer 420 controls a data path between the first port control unit 200a and the A bank 100a in response to the first select control signal ICMD_1. For example, if the first select control signal ICMD_1 is generated in response to the access path control command signals Fix_1 and Shared, the first data multiplexer 420 controls to electrically connect the data line DL of the A bank 100a with the first data sense amplifier 210 or the first data driver 220 in the first port control unit 200a. Accordingly, data input through the first input/output port may be stored in the memory cell of the A bank 100a, and data stored in the A bank 100a may be sensed and output through the first input/output port.

The second data multiplexer 430 controls a data path between the second port control unit 300a and the A bank 100a in response to the second select control signal ICMD_2. For example, if the second select control signal ICMD_2 is generated in response to the access path control command signals Fix_2 and Shared, the second data multiplexer 430 controls to electrically connect the data line DL of the A bank 100a with the second data sense amplifier 310 or the second data driver 320 in the second port control unit 300a. Accordingly, data input through the second input/output port may be stored in the memory cell of the A bank 100a, and data stored in the A bank 100a may be sensed and output through the second input/output port.

The address multiplexer portion 440 and 450 controls the address path between the first and second input/output port control units 200a and 300a and the A bank 100a in response to the select control signals ICMD_1 and ICMD_2. The row address multiplexer 440 controls a row address path between the first port control unit 200a and the A bank 100a in response to the First select control signal ICMD_1, and controls a row address path between the second port control unit 300a and the A bank 100a in response to the second select control signal ICMD_2. For example, when the first select control signal ICMD_1 is generated in response to the access path control command signals Fix_1 and Shared, the row address multiplexer 440 delivers a row address signal ADD_1 input through the first input/output port to the row decoder 110. When the second select control signal TCMD_2 is generated in response to the access path control command signals Fix_2 and Shared, the row address multiplexer 440 delivers a row address signal ADD_2 input through the second input/output port to the row decoder 110. Accordingly, a word line WL connected with a specific memory cell in the A bank 100a is selected and enabled.

The column address multiplexer 450 controls a column address path between the first port control unit 200a and the A bank 100a in response to the first select control signal ICMD_1, and controls a column address path between the second port control unit 300a and the A bank 100a in response to the second select control signal ICMD_2. For example, when the first select control signal ICMD_1 is generated in response to the access path control command signals Fix_1 and Shared, the column address multiplexer 450 delivers the column address signal ADD_1 input through the first input/output port to the column decoder 120. When the second select control signal ICMD_2 is generated in response to the access path control command signals Fix_2 and Shared, the column address multiplexer 450 delivers the column address signal ADD_2 input through the second input/output port to the column decoder 110. Accordingly, a bit line BL connected with a specific memory cell in the A bank 100a is selected. Here, the row address signal and the column address signal are not the same but indicated by the same reference numeral since they are included in typical address signals ADD_1 and ADD_2.

FIGS. 4 to 8 illustrate examples of components of the first port control unit 200a and the select control unit 400a in FIG. 3. Components of the second port control unit 300a may be similarly configured as the components of the first port control unit 200a. Thus, a description of the components of the second port control unit 300a is omitted.

Figure 4:
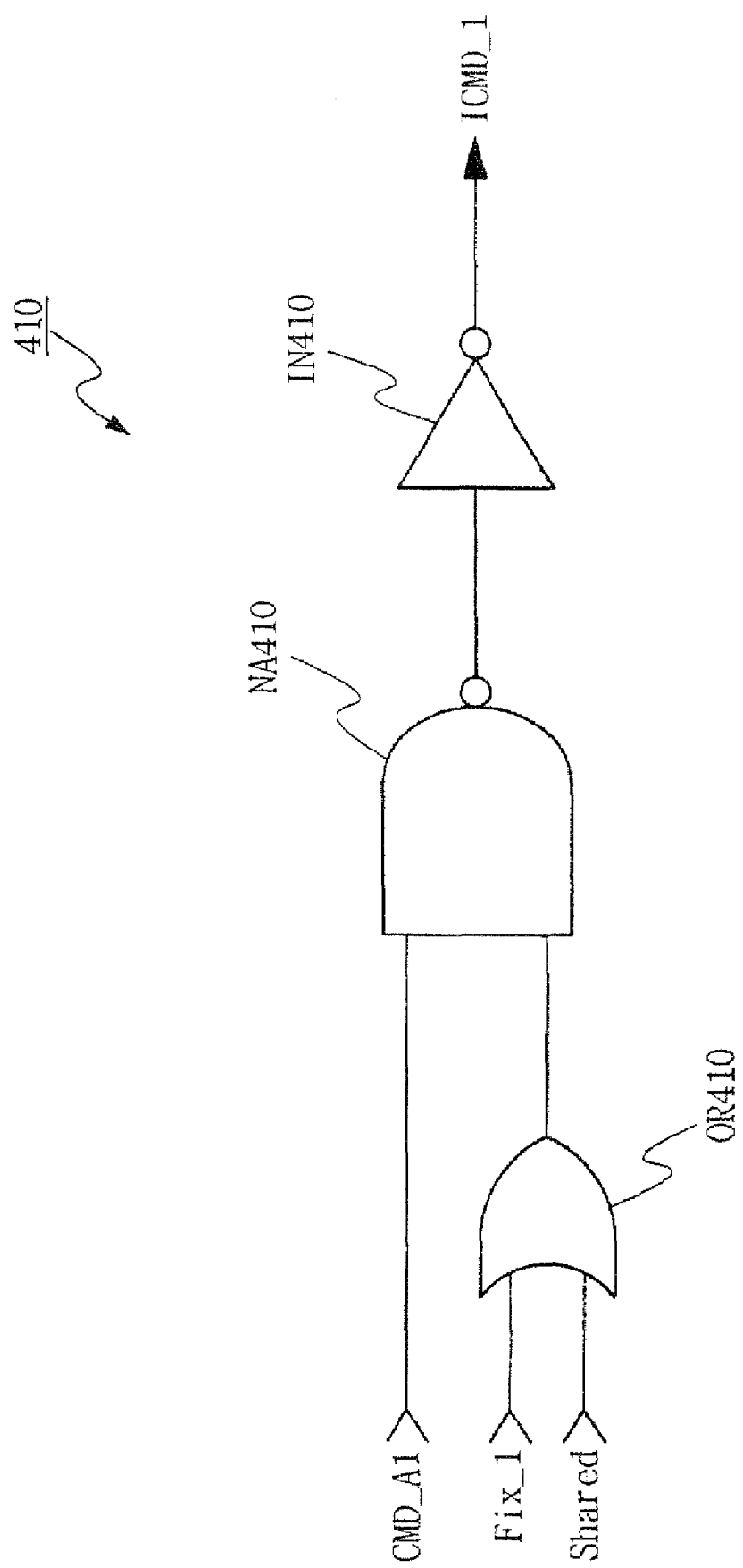
FIG. 4 is a circuit diagram of a first command multiplexer of FIG. 3.

FIG. 4 illustrates an example of the first command multiplexer 410 of FIG. 3. The second command multiplexer 460 of FIG. 3 may be similarly configured as the first command multiplexer 410.

The first command multiplexer 410 includes a logic OR circuit OR410, a logic NAND circuit NA410, and an inverter circuit IN410. The logic OR circuit OR410 performs a logic operation on external access path control command signals Fix_1 and Shared and outputs a logic signal. For example, the logic OR circuit OR410 outputs a logic 'low' signal when the access path command signals Fix_1 and Shared are both logic 'low', and outputs a logic 'high' signal when any one of the access path command signals Fix_1 and Shared is logic 'high'.

The logic NAND circuit NA410 performs a logic operation on the output signal of the logic OR circuit OR410 and an A bank select signal CMD_A1. The logic NAND circuit NA410 outputs a logic 'low' signal when the output signal of the logic OR circuit OR410 and the A bank select signal CMD_A1 received through the first input/output port are both logic 'high', and outputs a logic 'high' signal, otherwise. The inverter circuit IN410 then inverts the output signal of the NAND circuit NA410 and outputs the first select control signal ICMD_1.

Referring back to FIG. 3, the A bank select signal CMD_A1 contributing to generation of the first select control signal ICMD_1 and the A bank select signal CMD_A2 contributing to generation of the second select control signal ICMD_2 are the same signal for selecting the A bank and are merely classified depending on an input/output port used to apply the signal. Accordingly, the A bank select signal CMD_A1 and the A bank select signal CMD_A2 cannot simultaneously have a logic 'high' level.

Figure 5:
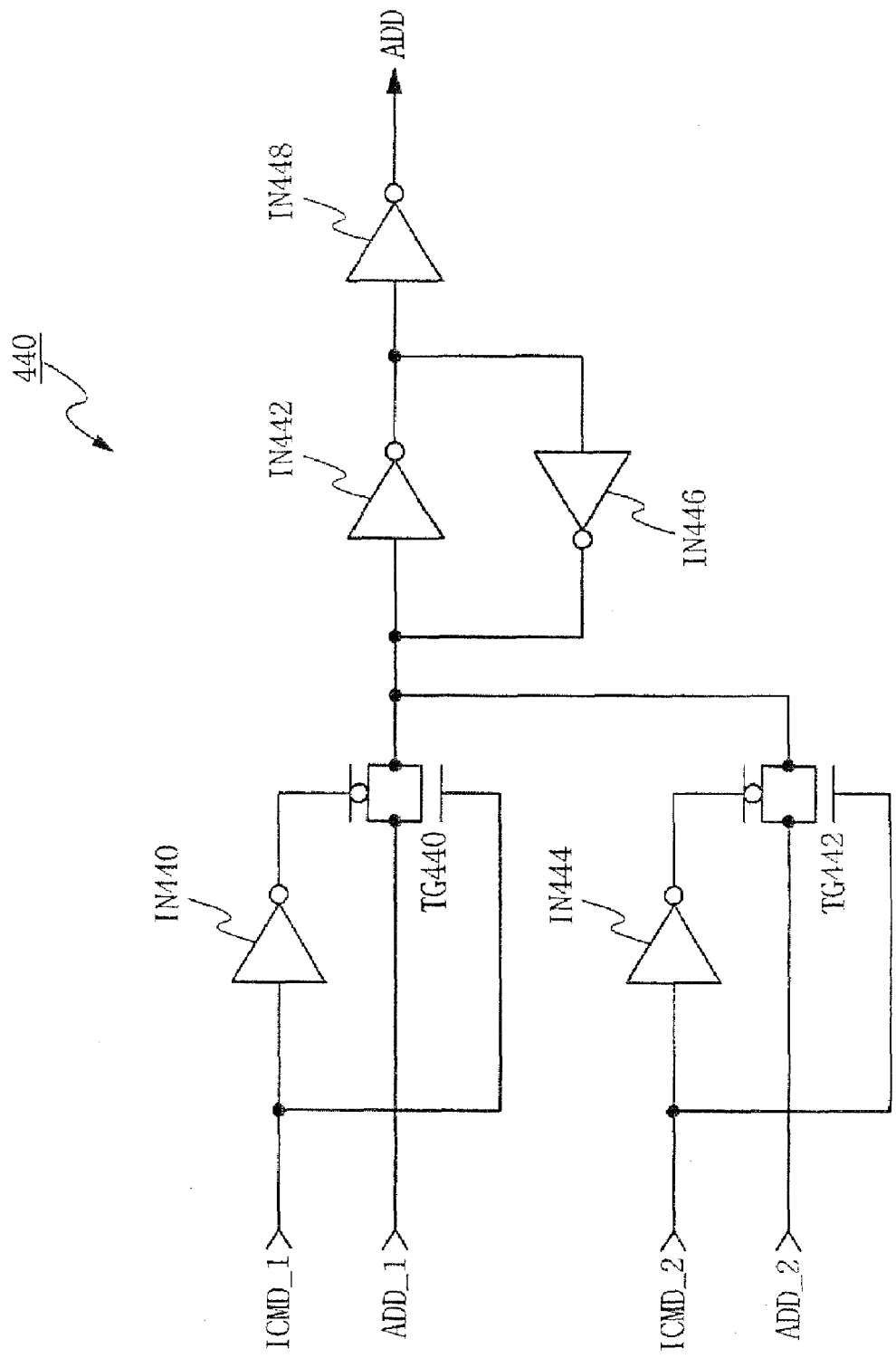
FIG. 5 is a circuit diagram illustrating a row address multiplexer of FIG. 3.

FIG. 5 illustrates an example of the row address multiplexer 440 of FIG. 3. The column address multiplexer 450 of FIG. 3 has a similar configuration as the row address multiplexer 440 except that the column address multiplexer 450 receives the column address signal instead of the row address signal and applies an output signal to the column decoder 120. Accordingly, a description of the column address multiplexer 450 is omitted.

The row address multiplexer 440 includes inverter circuits IN440, IN442, IN444, IN446, and IN448 and transfer gates TG440 and TG442. The transfer gate TG440 operates when the first select control signal ICMD_1 is logic 'high' and the second select control signal ICMD_2 is logic 'low'. Accordingly, an address signal ADD_1 received through the first input/output port control unit 200a is transferred via the transfer gate TG440, latched in a latch circuit including inverters IN442 and IN446, and then sent to the row decoder 110. The other transfer gate TG442 operates when the first select control signal ICMD_L is logic 'low' and the second select control signal ICMD_2 is logic 'high'. Accordingly, an address signal ADD_2 received through the second input/output port control unit 300a is transferred via the transfer gate TG442, latched in a latch circuit including inverters IN442 and IN446, and then sent to the row decoder 110. The transfer gates TG440 and TG442 do not operate when the first select control signal ICMD_1 and the second select control signal ICMD_2 are both logic 'low'. Accordingly, the address signal is not applied to the row decoder 110.

The first select control signal ICMD_1 and the second select control signal ICMD_2 cannot simultaneously be logic 'high'. This is because the A bank select signal CMD_A1 contributing to generation of the first select control signal ICMD_1 and the A bank select signal CMD_A2 contributing to generation of the second select control signal ICMD_2 are set not to simultaneously be logic 'high'.

Figure 6:
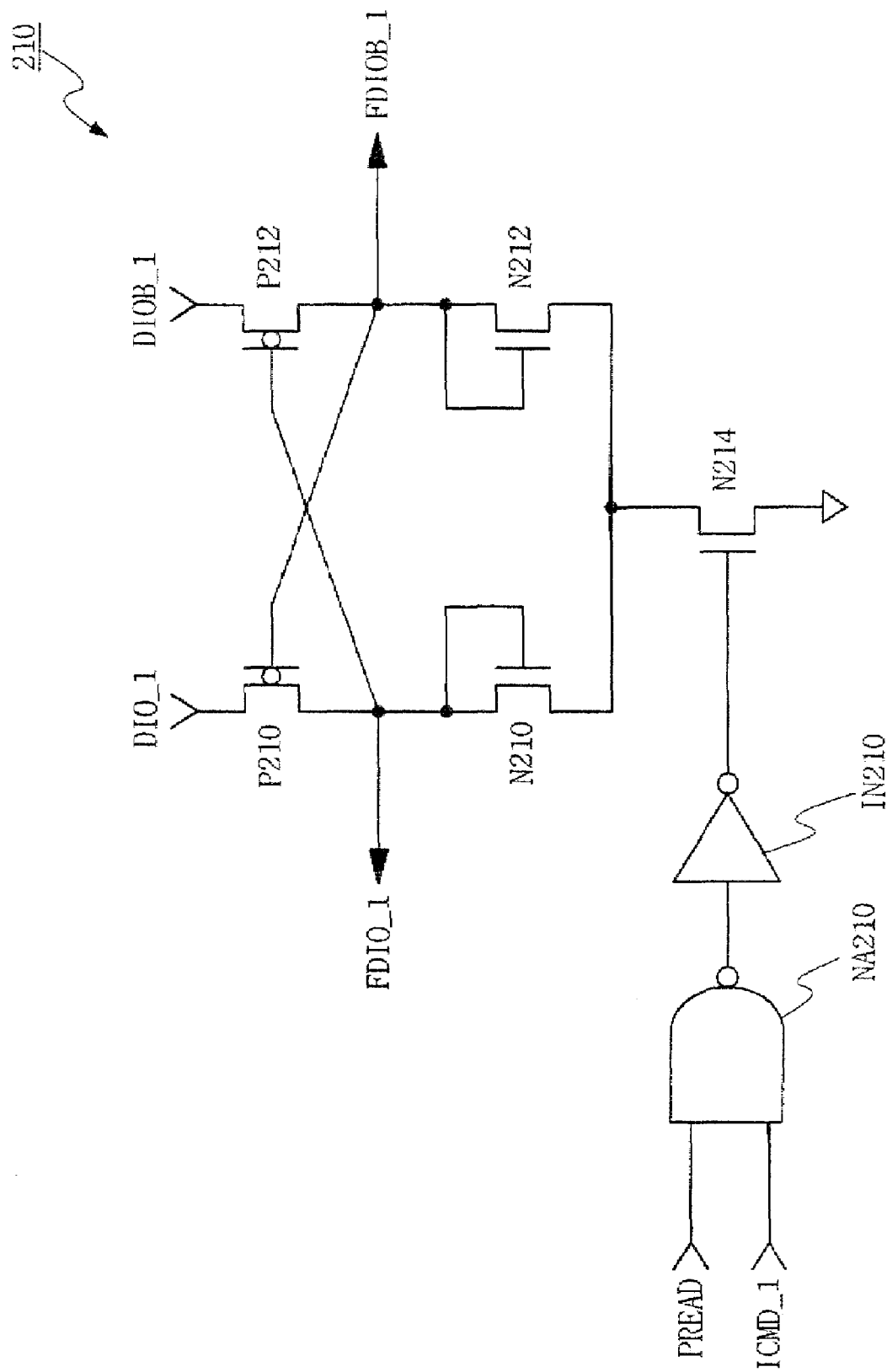
FIG. 6 is a circuit diagram illustrating a first data sense amplifier of FIG. 3.

FIG. 6 illustrates an example of the first data sense amplifier 210 in the first port control unit 200a of FIG. 3. The second data sense amplifier 310 in the second port control unit 300a may be similarly configured as the first data sense amplifier 210.

The first data sense amplifier 210 includes PMOS transistors P210 and P212, NMOS transistors N210, N212 and N214, an inverter IN210, and a NAND circuit NA210. Unlike a conventional sense amplifier circuit, the first data sense amplifier 210 includes the inverter IN210 and the NAND circuit NA210. That is, the first data sense amplifier 210 senses and amplifies data DIO_1 and DIOB_1 read from the A bank 100a. The first data sense amplifier 210 sends output data FDIO_1 and FDIOB_1 to a data output buffer (not shown) and/or an output driver (not shown) of the first port control unit 200a.

While the conventional data sense amplifier operates in response to an applied read command signal PREAD because the read command signal PREAD is input to a gate of an NMOS transistor N214, the first data sense amplifier 210 operates in response to a combination of the read command signal PREAD and the first select control signal ICMD_1. For example, the first data sense amplifier 210 may operate only when both the read command signal PREAD and the first select control signal ICMD_1 are logic 'high'. This means that the first data sense amplifier 210 can operate in response to the first select control signal ICMD_1 only when the A bank is either the first input/output port dedicated access area or the shared access area. Thus, power consumption can be reduced and efficient operation can be achieved. The first data sense amplifier as described above is applicable to all normally used data sense amplifiers. That is, the first data sense amplifier 210 can be implemented by a cross-coupled data sense amplifier, a current mirror type data sense amplifier, or the like.

Figure 7:
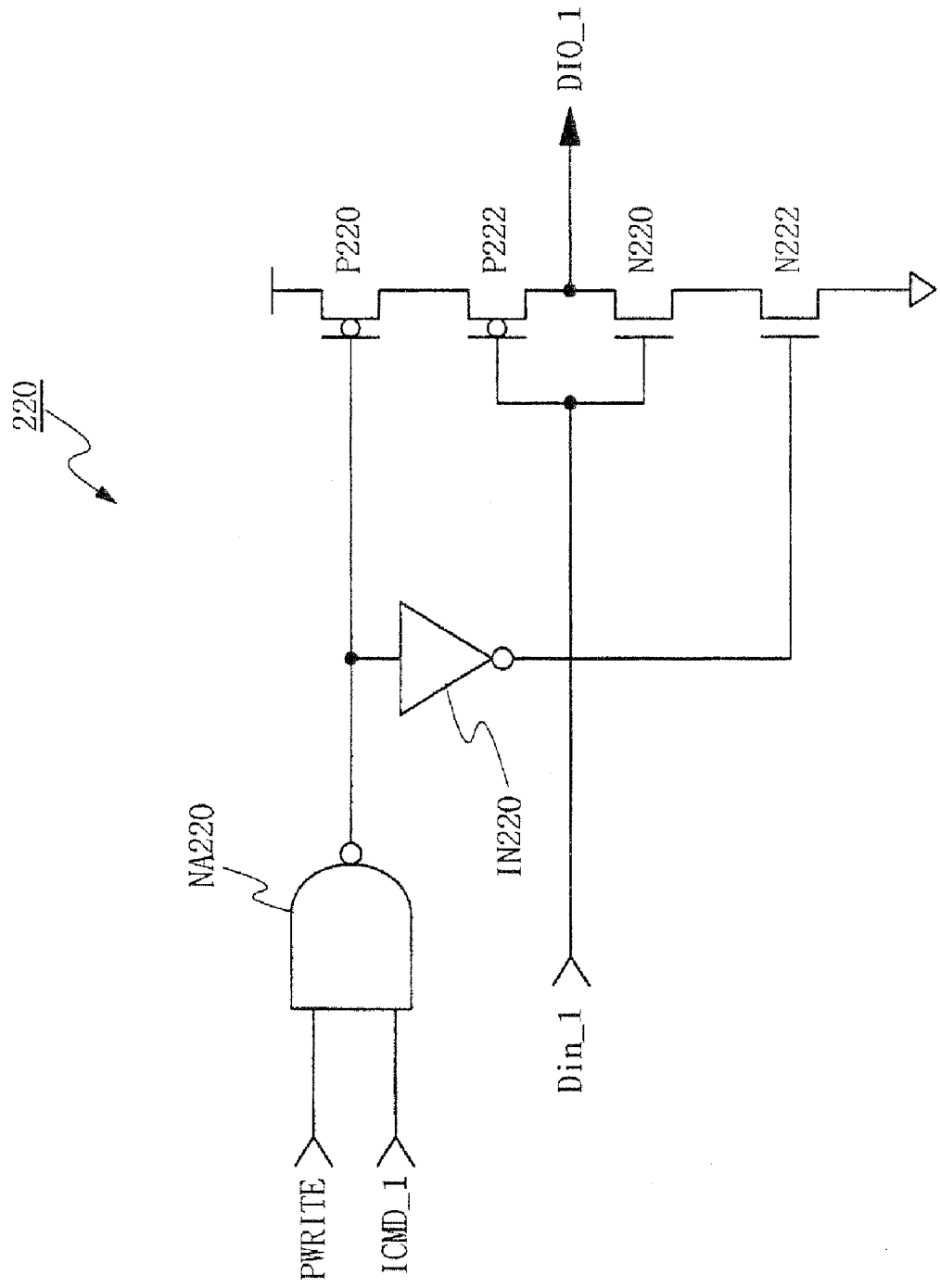
FIG. 7 is a circuit diagram illustrating a first data driver of FIG. 3.

FIG. 7 illustrates an example of the first data driver 220 in the first port control unit 200a of FIG. 3. The second data driver 320 in the second port control unit 300a may be similarly configured as the first data driver 320.

The first data driver 220 includes PMOS transistors P220 and P222, NMOS transistors N220 and N222, a logic NAND circuit NA220, and an inverter circuit IN220. For a write operation, the First data driver 220 drives and outputs the data Din_1 which is input through a data input buffer (not shown) in the first port control unit 200a. Data DIO_1 output from the first data driver 220 is sent to the A bank 100a via the first data multiplexer 420.

Figure 8:
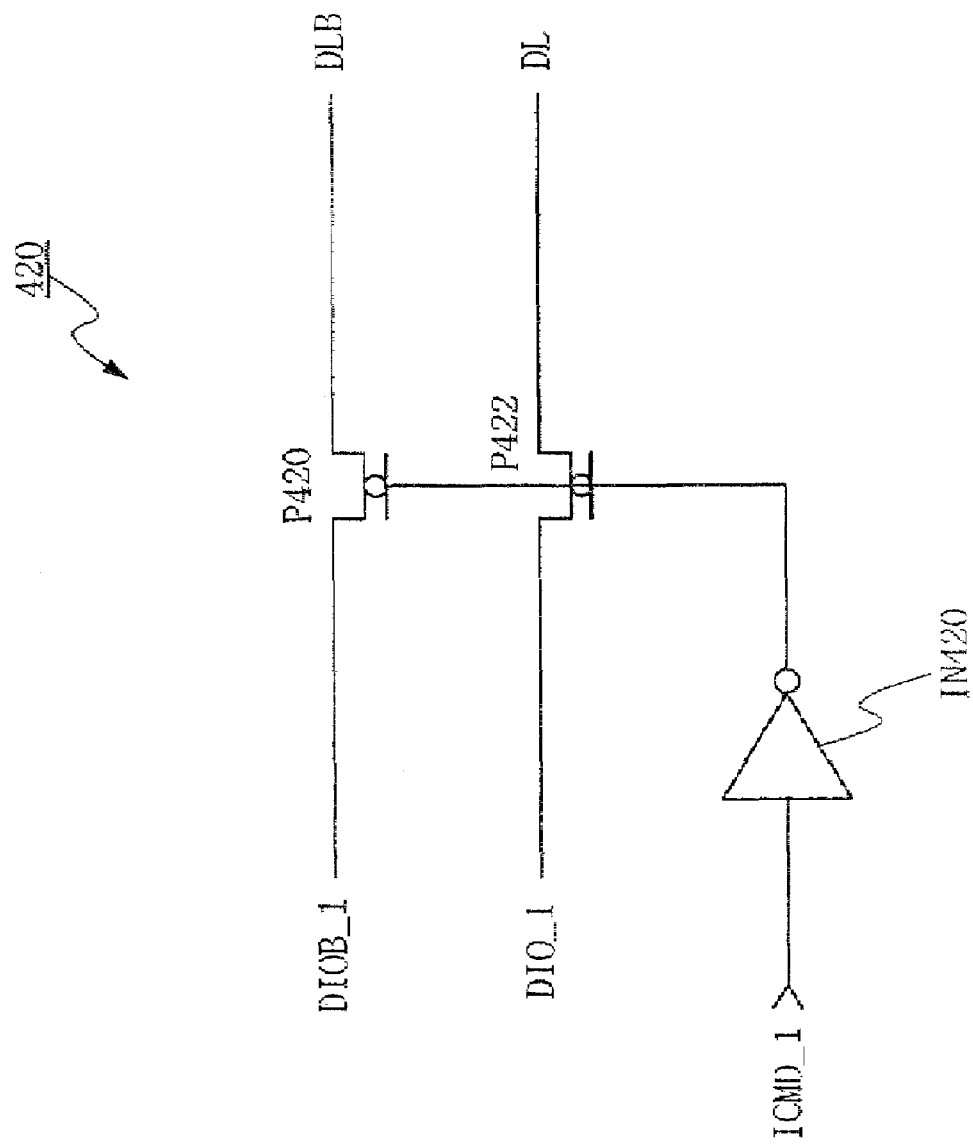
FIG. 8 is a circuit diagram illustrating a first data multiplexer of FIG. 3.

In the conventional data driver circuit, a write command signal PWRITE or its inverted signal is input to gates of the PMOS transistor P220 and the NMOS transistor N222. Accordingly, the data driver operates only when the write command signal PWRITE (e.g., logic 'high') is applied. Unlike the conventional data driver circuit, the first data driver 220 operates in response to a combination of the write command PWRITE and the first select control signal ICMD_1. For example, the first data driver 220 may operate only when the write command signal PWRITE and the first select control signal ICMD_1 are both logic 'high'. This means that the first data driver 220 can operate in response to the first select control signal ICMD_1 only when the A bank is either the first input/output port dedicated access area or the shared access area. Thus, power consumption can be reduced and efficient operation can be achieved. The first data driver as described above is applicable to all normally used data drivers, and other data input circuits, FIG. 8 illustrates an example of the first data multiplexer 420 of FIG. 3. The second data multiplexer 430 may be similarly configured as the first data multiplexer 420. The first data multiplexer 420 includes an inverter IN420 and PMOS transistors P420 and P422.

The first data multiplexer 420 controls data transmission of the A bank 100a and the first port control unit 200a through the PMOS transistors P420 and P422 responsive to an inverted version of the first select control signal ICMD_1. For example, data sensed from the A bank 100a can be sent to the first port control unit 200a only when the first select control signal ICMD_1 is logic 'high'. Further, data input via the first port control unit 200a is sent to the A bank 100a for the write operation only when the first select control signal ICMD_1 is logic 'high'.

The circuits illustrated in FIGS. 3 to 8 are only examples provided for illustration purposes. It will be appreciated by those skilled in the art that other equivalent circuits or other variant circuits performing the operation illustrated in FIGS. 3 to 8 are included in the scope of the invention.

FIGS. 9 to 15 illustrate examples of memory area allocation operations through variable access path control in the semiconductor memory device having the structure as described above according to an embodiment of the invention. These examples are provided for illustration purposes and should not be construed to limit the scope of the invention.

The semiconductor memory device according to the invention may include a plurality of input/output ports and a memory array divided into a plurality of memory areas. For convenience of understanding, however, the semiconductor memory device is shown in FIGS. 9 to 15 as including a memory array 100 divided into four memory banks and two input/output ports.

While the embodiments have been described in connection with the A bank 100a, it will be appreciated by those skilled in the art that the configuration as described above can be obtained in connection with other memory banks. It is assumed that a B bank select signal corresponding to the A bank select signal CMD_A1 applied through the first port control unit 200 is 'CMD_B1' and a B bank select signal corresponding to the A bank select signal CMD_A2 applied through the second port control unit 300 is 'CMD_B2'. In this manner, it may be assumed that a C bank select signal and a D bank select signal are 'CMD_D1' and 'CMD_D2'.

As previously described, the access path control command signals Fix_1, Fix_2, and Shared have the same designation but are separate and independently applied signals for an access path to each memory bank. For example, the access path control command signals Fix_1, Fix_2, and Shared as shown in FIGS. 3 to 8 are for the access path to the A bank 100a and do not affect access paths to remaining banks.

Figure 9:
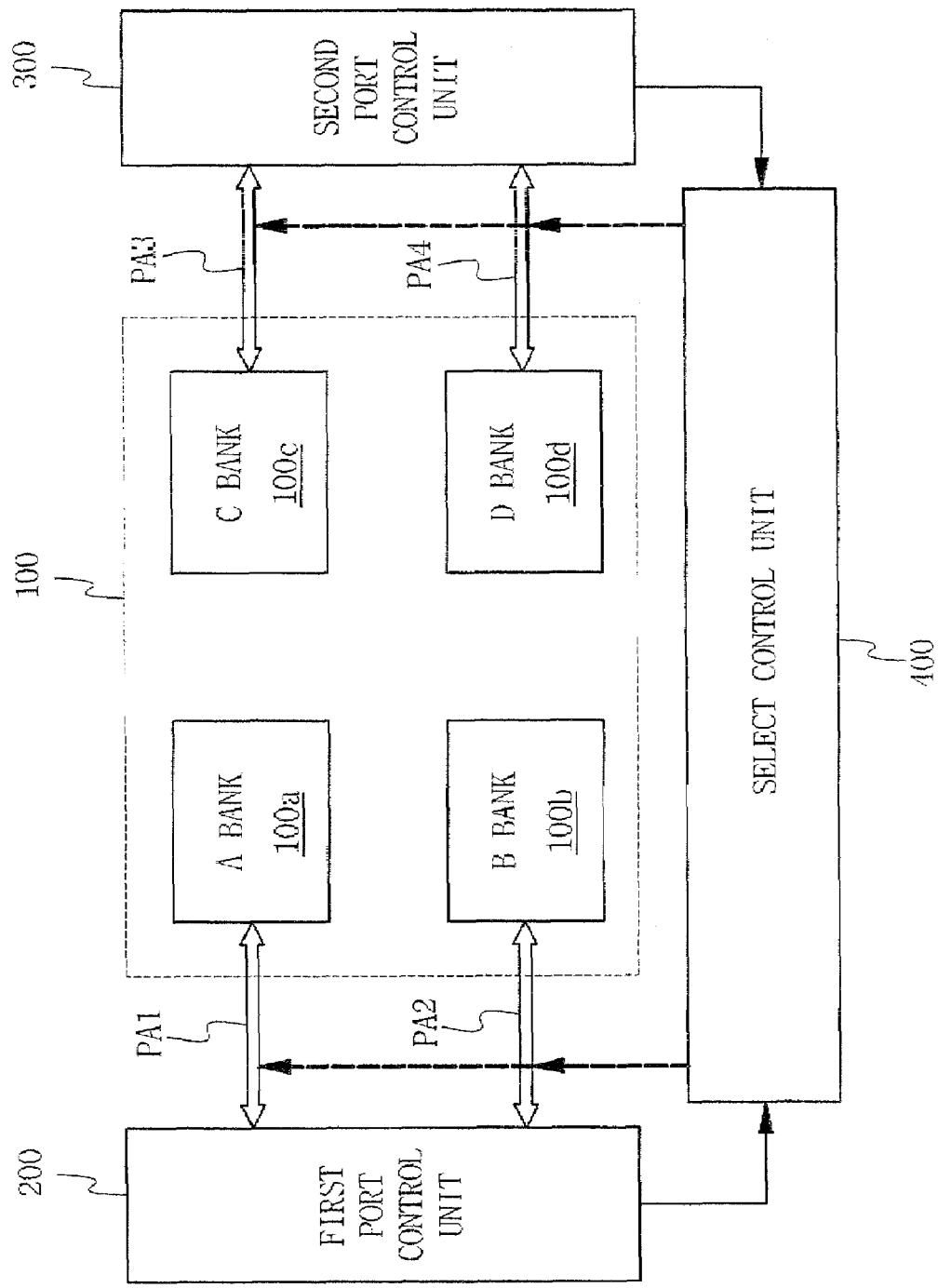
FIGS. 9 to 15 illustrate an example of an access path control operation in a semiconductor memory device according to an embodiment of the invention.

FIG. 9 illustrates an example in which the A bank 100a and the B bank 100b are allocated as the first input/output port dedicated access area, and the C bank 100c and the D bank 100d are allocated as the second input/output port dedicated access area.

To allocate the A bank 100a as the first input/output port dedicated access area, an access path PA1 may be established between the A bank 100a and the first port control unit 200. That is, an A bank select signal CMD_A1 and the access path control command signal Fix_1 generated only for the A bank 100a may be enabled. For example, as described in FIGS. 3 to 8, when the A bank select signal CMD_A1 is applied at a logic 'high' level and when the signal Fix_1 is applied at a logic 'high' level, the A bank 100a is allocated as the first input/output port dedicated access area. The command signals CMD_A2, Fix 2 and Shared remain at logic 'low' level.

To allocate the B bank 100b as the first input/output port dedicated access area, an access path PA2 may be established between the B bank 100b and the first port control unit 200. That is, a B bank select signal CMD_B1 and the access path control command signal Fix_1 generated only for the B bank 100b may be enabled. For example, as in the A bank 100a, when the B bank select signal CMD_B1 is applied at a logic 'high' level and when the signal Fix_1 is applied at a logic 'high' level, the B bank 100b is allocated as the first input/output port dedicated access area. The command signals CMD_B2, Fix_2 and Shared remain at logic 'low' level.

To allocate the C bank 100c as the second input/output port dedicated access area, an access path PA3 may be established between the C bank 100c and the second port control unit 300. That is, a C bank select signal CMD_C2 and the access path control command signal Fix_2 generated only for the C bank 100c may be enabled. For example, as in the A bank 1000a, when the C bank select signal CMD_C2 is applied at a logic 'high' level and when the signal Fix_2 generated only for the C bank 100c is applied at a logic 'high' level, the C bank 100c is allocated as the second input/output port dedicated access area. The command signals CMD_C1, Fix_1 and Shared remain at logic 'low' level.

To allocate the D bank 100d as the second input/output port dedicated access area, an access path PA4 may be established between the D bank 100d and the second port control unit 300. That is, when the D bank select signal CMD_D2 is applied at a logic 'high' level and when the signal Fix_2 generated only for the D bank 100d is applied at a logic 'high' level, the D bank 100d is allocated as the second input/output port dedicated access area. The command signals CMD_D1, Fix_1 and Shared remain at logic 'low' level.

Figure 10:
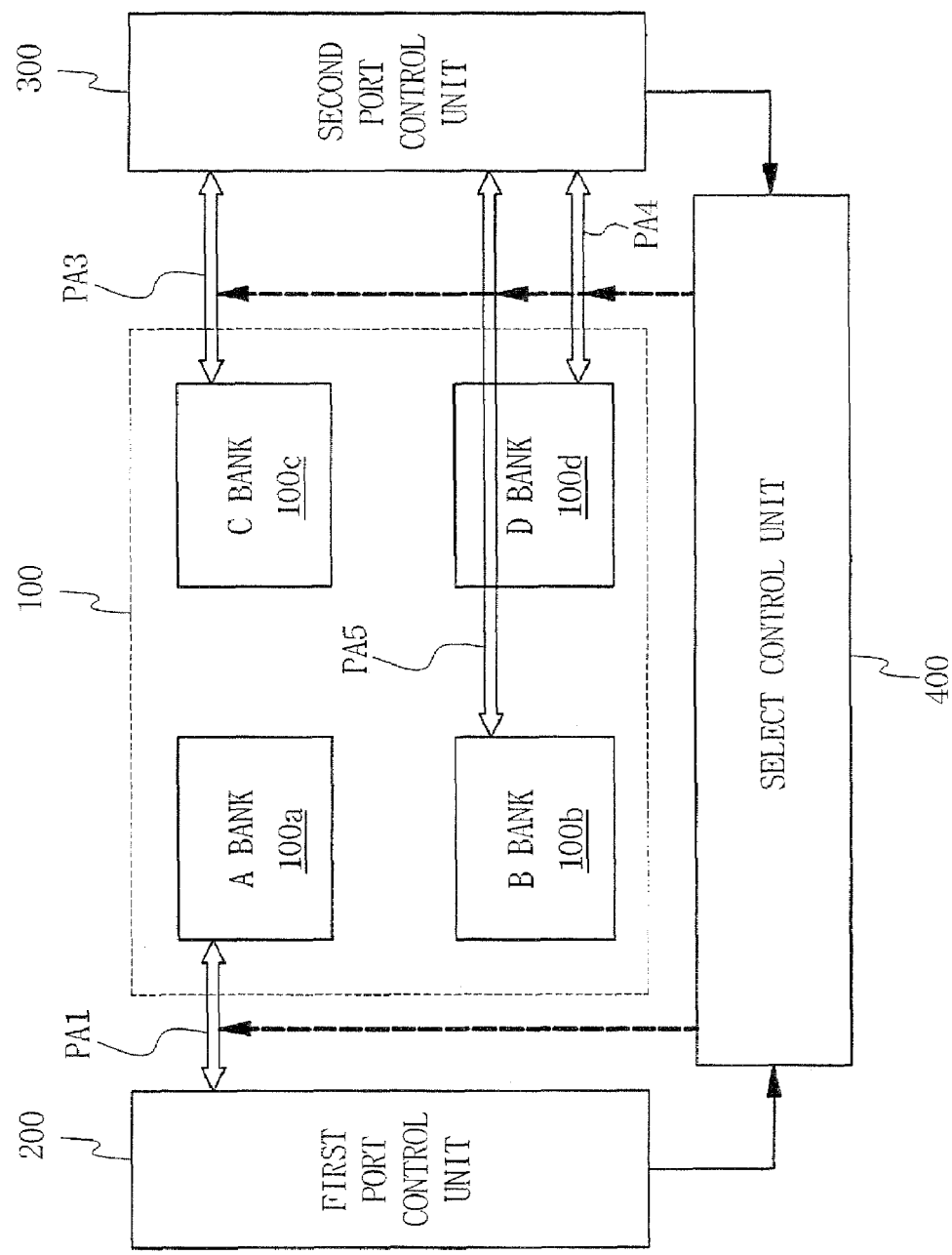

FIG. 10 illustrates an operation example in which the A bank 100a is allocated as the first input/output port dedicated access area, and the B bank 100b, the C bank 100c, and the D bank 100d are allocated as the second input/output port dedicated access area.

To allocate the A bank 100a as the first input/output port dedicated access area, an access path PA1 may be established between the A bank 100a and the first port control unit 200 as previously described with reference to FIG. 9.

To allocate the B bank 100b as the second input/output port dedicated access area, an access path PA5 may be established between the B bank 100b and the second port control unit 300. That is, a B bank select signal CMD_B2 and the access path control command signal Fix_2 generated only for the B bank 100b may be enabled. For example, when the B bank select signal CMD_B2 is applied at a logic 'high' level and when the signal Fix_2 for allocating the B bank 100b as the second input/output port dedicated access area is applied at a logic 'high' level, the B bank 100b is allocated as the second input/output port dedicated access area. The command signals CMD_B1, Fix_1 and Shared remain at logic 'low' level.

To allocate the C bank 100c and the D bank 100d as the second input/output port dedicated access areas, access paths PA3 and PA4 may be established as previously described with reference to FIG. 9.

Figure 11:
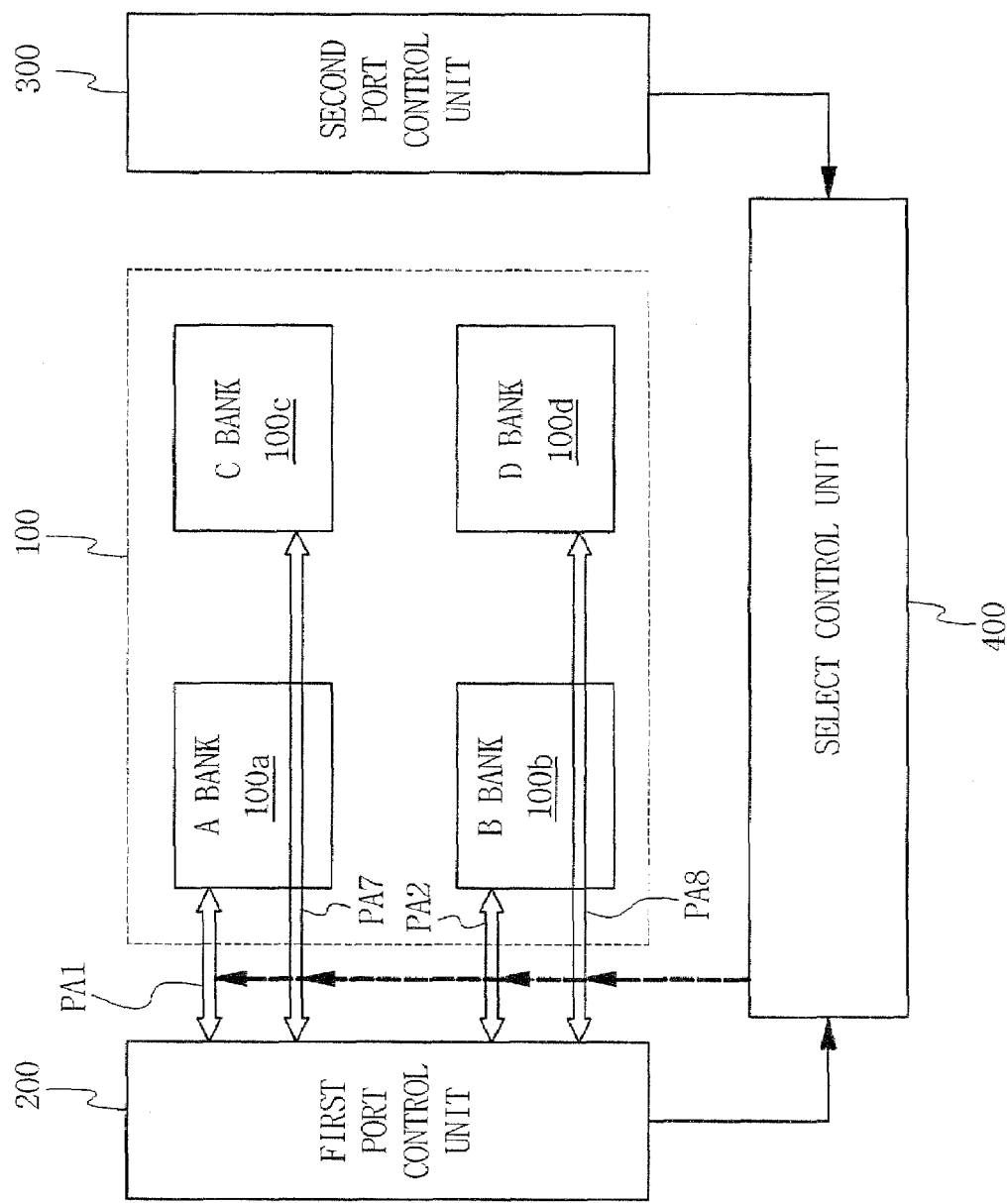

FIG. 11 shows an operation example in which the A bank 100a, the B bank 100b, the C bank 100c, and the D bank 100d are all allocated as the first input/output port dedicated access area. Thus, the multi-port semiconductor memory device can operate as a single port semiconductor memory device.

To allocate all of the A bank 100a, the B bank 100b, the C bank 100c, and the D bank 100d as the first input/output port dedicated access area, access paths PA1, PA2, PA7, and PA8 may be established between the respective memory banks 100a, 100b, 100c and 100d and the first port control unit 200. An allocation operation example of setting the A bank 100a and the B bank 100b as the first input/output port dedicated areas has been described in FIG. 9 and, thus, a description thereof is omitted.

To allocate the C bank 100c as the first input/output port dedicated access area, an access path PA7 may be established between the C bank 100c and the first port control unit 200. When the C bank select signal CMD_C1 is applied at a logic 'high' level and when the signal Fix_1 for allocating the C bank 100c as the first input/output port dedicated access area is applied at a logic 'high' level, the C bank 100c is allocated as the first input/output port dedicated access area. The command signals CMD_C2, Fix_2 and Shared remain at logic 'low' level.

To allocate the D bank 100*d* as the first input/output port dedicated access area, an access path PA8 may be established between the D bank 100*d* and the first port control unit 200. When the D bank select signal CMD_D1 is applied at a logic 'high' level and when the signal Fix_1 for allocating the D bank 100*d* as the first input/output port dedicated access area is applied at a logic 'high' level, the D bank 100*d* is allocated as the first input/output port dedicated access area. The command signals CMD_C2, Fix_2 and Shared remain at logic 'low' level.

Figure 12:
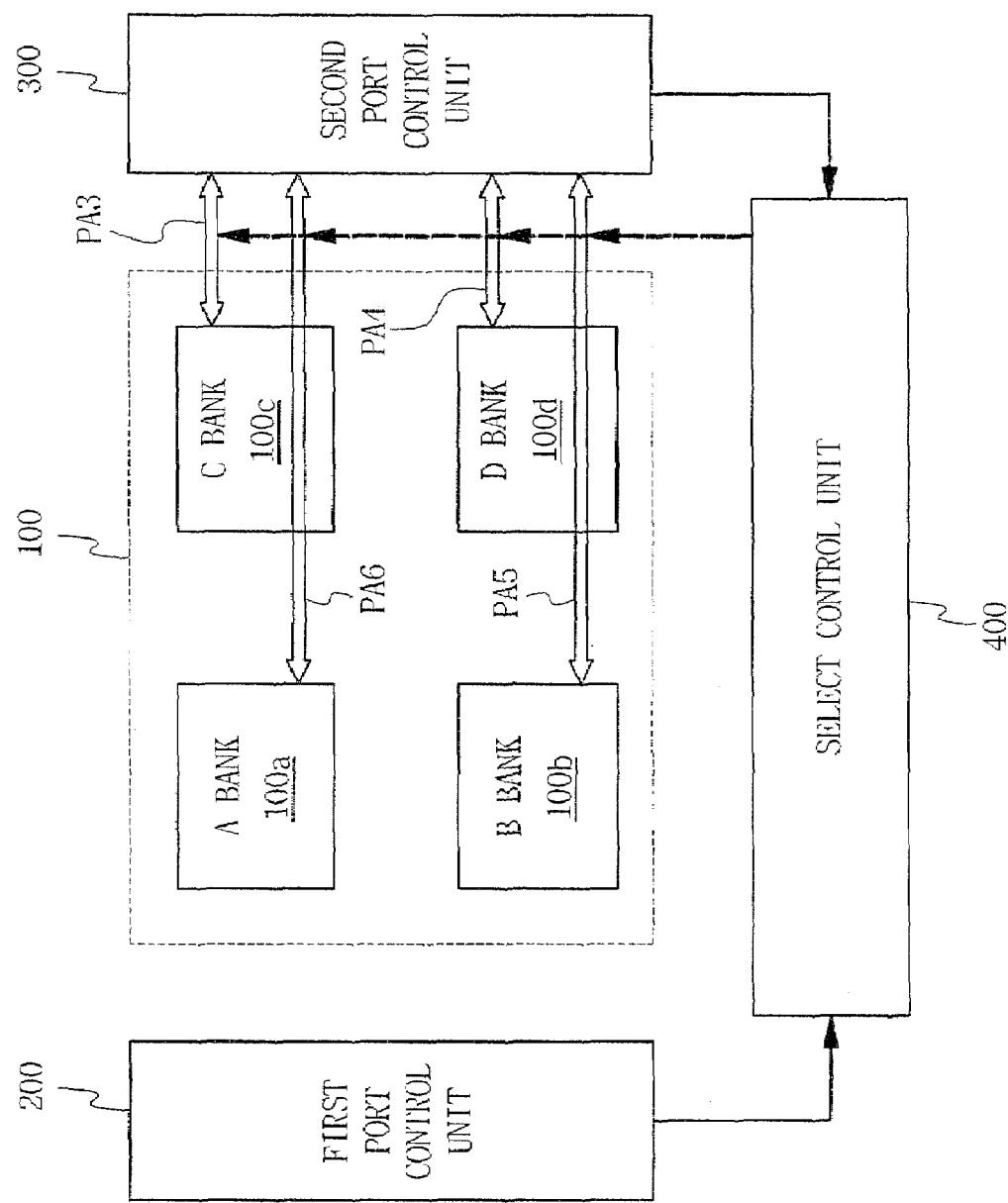

FIG. 12 shows an operation example in which the A bank 100*a*, the B bank 100*b*, the C bank 100*c*, and the D bank 100*d* are all allocated as the second input/output port dedicated access area. As in FIG. 11, this multi-port semiconductor memory device can operate as a single port semiconductor memory device. To allocate all of the A bank 100*a*, the B bank 100*b*, the C bank 100*c*, and the D bank 100*d* as the second input/output port dedicated access area, access paths PA3, PA4, PA5, and PA6 may be established between the respective memory banks 100*a*, 100*b*, 100*c* and 100*d* and the second port control unit 300. The allocation operation is similar to the operation described in FIG. 11 and need not be described in further detail.

Figure 13:
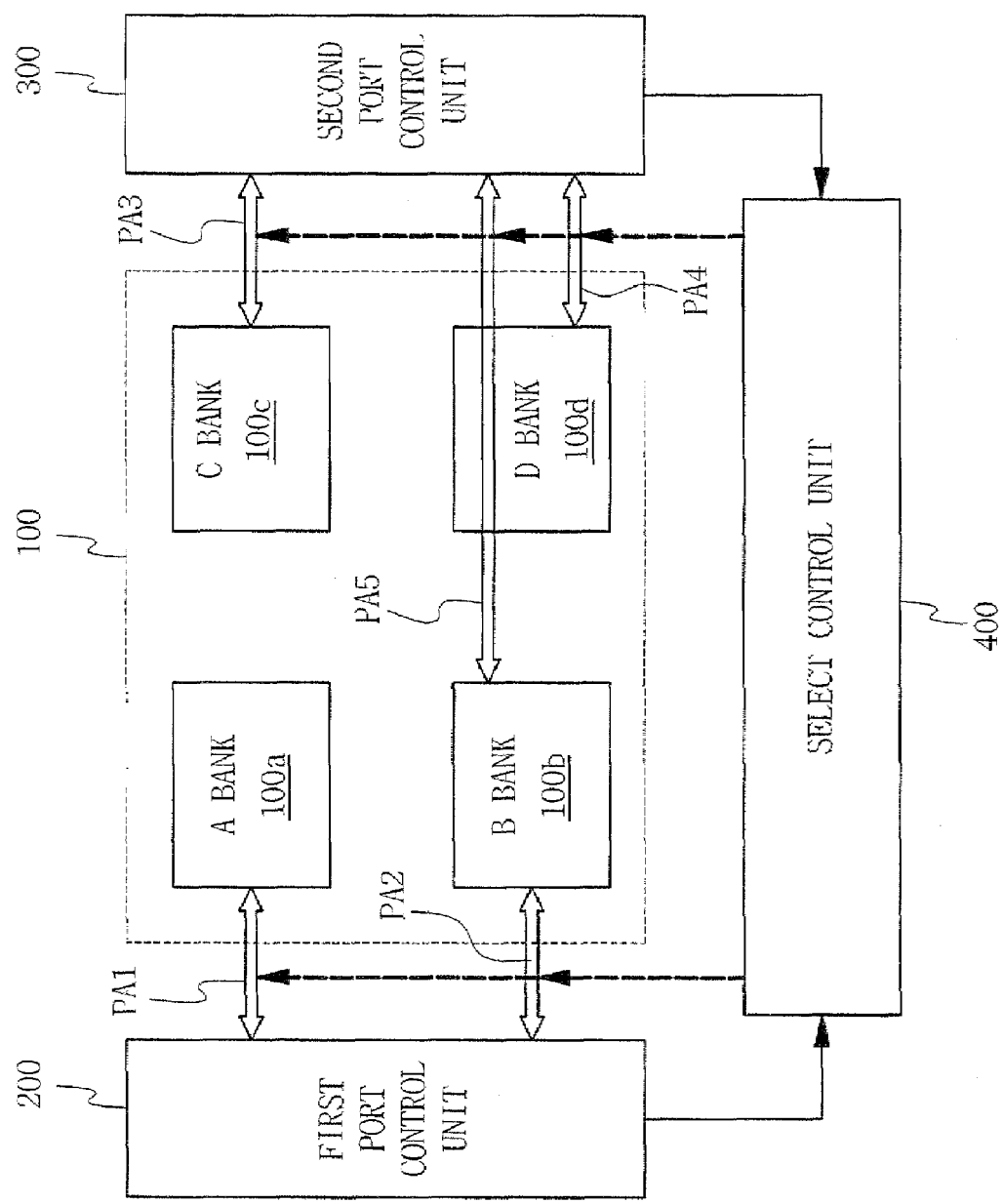

FIG. 13 illustrates an operation example in which the A bank 100*a* is allocated as the first input/output port dedicated access area, the B bank 100*b* as the shared access area, and the C bank 100*c* and the D bank 100*d* as the second input/output port dedicated access area. This case corresponds to a case in which there is the shared access area which can be accessed at both the first and second input/output ports.

An access path PA1 may be established in order to allocate the A bank 100*a* as the first input/output port dedicated access area. Further, access paths PA3 and PA4 may be established between the respective C bank 100*c* and the D bank 100*d* and the second port control unit 300 in order to allocate the C bank 100*c* and the D bank 100*d* as the second input/output port dedicated access area. These allocation operations have been previously described in FIGS. 9 to 12 and need not be described in further detail.

To allocate the B bank 100*b* as the shared access area, the access path PA2 with the first port control unit 200 and the access path PA5 with the second port control unit 300 may be established. To this end, the signal Shared for allocating the B bank 100*b* as the shared access area may first be applied at a logic 'high' level. In this state, an access operation may be performed through a desired one of the access path PA2 with the first port control unit 200 and the access path PA5 with the second port control unit 300. For example, the B bank select signal CMD_B1 may be applied at a logic 'high' level through the first port control unit in order to access the B bank 100*b* through the first input/output port. The B bank select signal CMD_B2 may then be applied at a logic 'high' level through the second port control unit in order to access the B bank 100*b* through the second input/output port. Thus, the access path may be determined depending on an input/output port used to apply the B bank select signal CMD_B1 or CMD_B2 at a logic 'high' level. Even when the signal Shared for allocating the B bank 100*b* as the shared access area is applied at a logic 'high' level, the first select control signal and the second select control signal for controlling the access paths PA2 and PA5 do not become a logic 'high' level. This provides an advantage of preventing collision between the input/output ports in the shared access area. The order of applying the command signals Shared, CMD_B1 and CMD_B2 can be changed.

Figure 14:
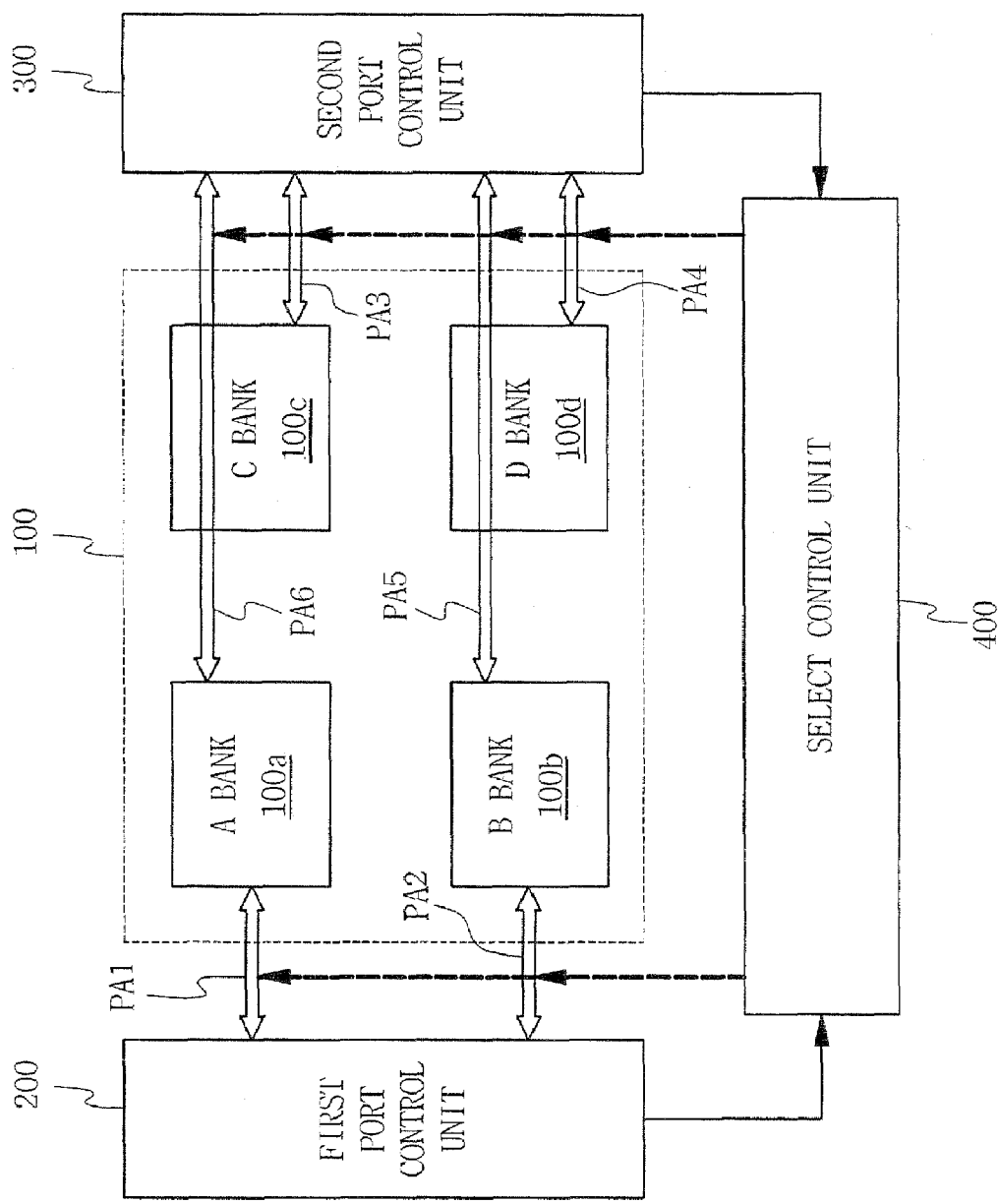

FIG. 14 illustrates an operation example in which the A bank 100*a* and the B bank 100*b* are allocated as the shared access area, and the C bank 100*c* and the D bank 100*d* as the second input/output port dedicated access area. In this case, the shared access area that can be accessed at both the first and second input/output ports includes two memory banks.

To allocate the C bank 100*c* and the D bank 100*d* as the second input/output port dedicated access area, access paths PA3 and PA4 may be established between the C bank 100*c* and the D bank 100*d* and the second port control unit 300 as previously described in FIGS. 9 to 13. Further, an operation of allocating the B bank 100*b* as the shared access area has been described in FIG. 13 and, thus, a description thereof is omitted.

To allocate the A bank 100*a* as the shared access area, the access path PA1 with the first port control unit 200 and the access path PA6 with the second port control unit 300 may be established. To this end, the signal Shared for allocating the A bank 100*a* as the shared access area may first be applied at a logic 'high' level. In this state, an access operation may be performed through a desired one of the access path PA1 with the first port control unit 200 and the access path PA6 with the second port control unit 300. For example, the A bank select signal CMD_A1 may be applied at a logic 'high' level through the first port control unit 200 in order to access the A bank 100*a* through the first input/output port. The A bank select signal CMD_A2 may be applied at a logic 'high' level through the second port control unit in order to access the A bank 100*a* through the second input/output port. Thus, the access path may be determined depending on an input/output port used to apply the A bank select signal CMD_A1 or CMD_B2 at a logic 'high' level. This provides an advantage of preventing collision between the input/output ports in the shared access area. The order of applying the command signals Shared, CMD_A1 and CMD_A2 can be changed.

Figure 15:
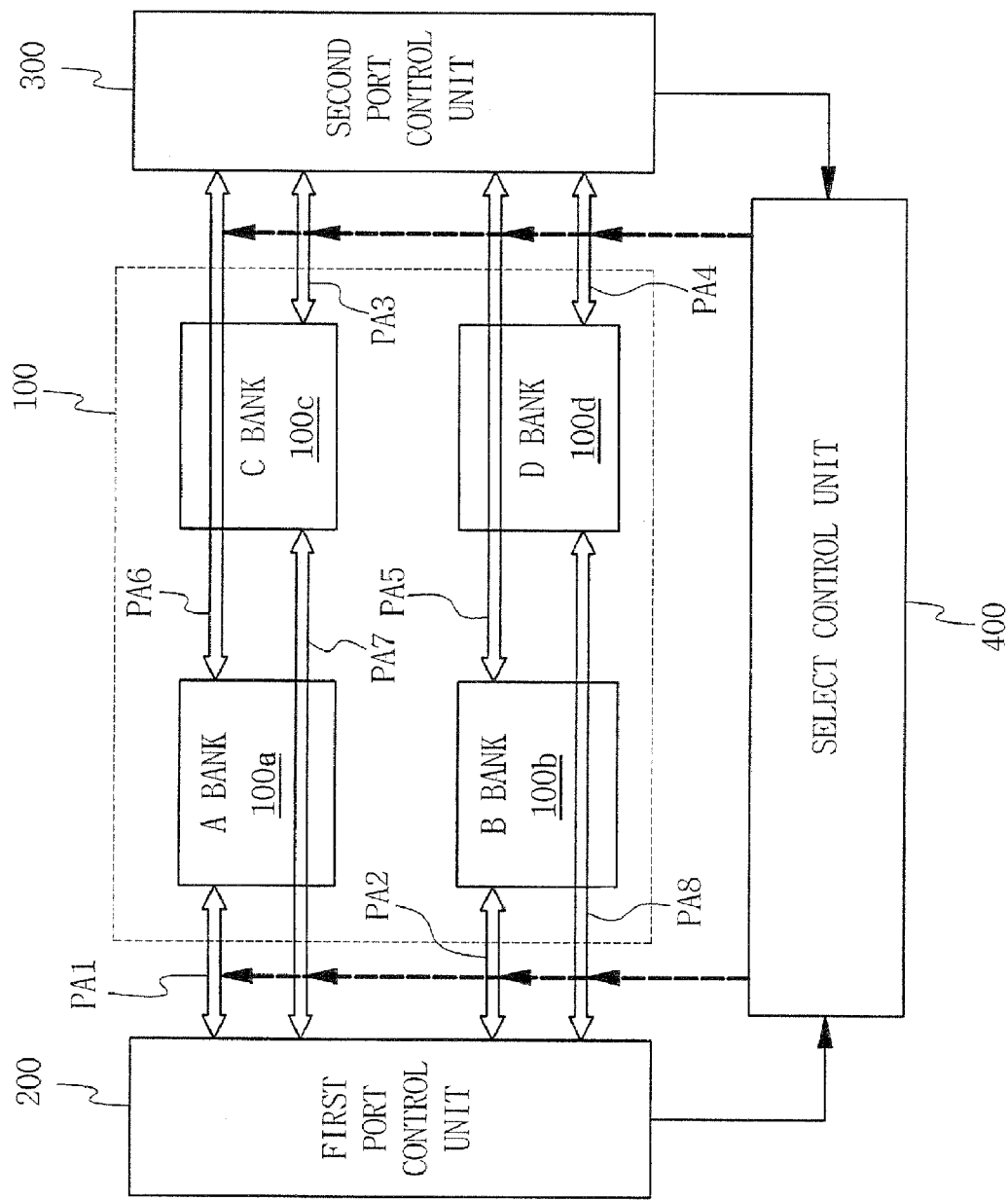

FIG. 15 illustrates an operation example in which all memory banks 100*a*, 100*b*, 100*c* and 100*d* are allocated as the shared access area. As shown in FIG. 15, access paths PA1, PA2, PA5 and PA6 may be established to allocate the A bank 100*a* and the B bank 100*b* as the shared access area as previously described in FIGS. 13 and 14.

To allocate the C bank 100*c* as the shared access area, the access path PA7 with the first port control unit 200 and the access path PA3 with the second port control unit 300 may be established. To this end, the signal Shared for allocating the C bank 100*c* as the shared access area may first be applied at a logic 'high' level, In this state, an access operation may be performed through a desired one of the access path PA7 with the first port control unit 200 and the access path PA3 with the second port control unit 300. For example, the C bank select signal CMD_C1 is applied at a logic 'high' level through the first port control unit 200 in order to access the C bank 100*c* through the first input/output port. The C bank select signal CMD_C2 is applied at a logic 'high' level through the second port control unit in order to access the C bank 100*c* through the second input/output port. In the C bank 100*c*, access collision is prevented between the input/output ports. The order of applying the command signals Shared, CMD_C1 and CMD_C2 can be changed.

To allocate the D bank 100*d* as the shared access area, the access path PA8 with the first port control unit 200 and the access path PA4 with the second port control unit 300 may be established. To this end, the signal Shared for allocating the D bank 100*d* as the shared access area is first applied at a logic 'high' level. In this state, an access operation may be performed through a desired one of the access path PA8 with the first port control unit 200 and the access path PA4 with the second port control unit 300. For example, the D bank select signal CMD_D1 is applied at a logic 'high' level through the first port control unit 200 in order to access the D bank 100d through the first input/output port. The D bank select signal CMD_D2 is applied at a logic 'high' level through the second port control unit in order to access the D bank 100d through the second input/output port. In the D bank 100d, access collision is prevented between the input/output ports, as well. The order of applying the command signals Shared, CMD_D1 and CMD_D2 can be changed.

The semiconductor memory device as described above according to an embodiment of the invention is also useful for testing. That is, the semiconductor memory device has an advantage when performing a test according to conditions by controlling the access paths in a given test environment.

For example, when the number of test pins of test equipment needs to be reduced, all of the memory banks 100a, 100b, 100c and 100d may be allocated as the first input/output port dedicated access area as in FIG. 11 or the second input/output port dedicated access area as in FIG. 12. Then, the test may be performed through the first input/output port or the second input/output port. Accordingly, the number of the test pins can be reduced. In this case, other memory devices may be tested using remaining test pins.

As another example, in order to reduce a test time, the memory banks 100a, 100b, 100c and 100d may be divided into two groups and allocated as the first input/output port dedicated access area and the second input/output port dedicated access area, as in FIG. 9. Then, testing may be performed through the first input/output port or the second input/output port. Accordingly, the test time can be reduced.

In addition, efficient testing can be achieved by controlling the access paths according to a test environment. Control of the access paths for the test operation may be performed through the operation as described in FIGS. 2 to 15. In this case, however, the external command signal may be an external command signal for test (e.g., MRS signal for test) or a combination of other input command signals.

According to the invention as described above, the access paths used to access the memory areas constituting the multi-port semiconductor memory device through the respective input/output ports may be variably controlled. Thus, the memory areas can be efficiently utilized by a user. In addition, the test according to a test environment is possible and, thus, efficient testing can be performed.

Having described exemplary embodiments of the invention, it should be apparent that modifications and variations can be made by persons skilled in the art in light of the above teachings. Therefore, it is to be understood that changes may be made to embodiments of the invention disclosed that are nevertheless within the scope and the spirit of the claims.

The invention claimed is:

1. A semiconductor memory device comprising:
a plurality of input/output ports;
a memory array divided into a plurality of memory areas; and
a select control unit to establish variable access paths between the memory areas and the input/output ports so that each memory area is accessed through at least one of the input/output ports, wherein the select control unit establishes the variable access paths directly in response to command signals external to the memory device, wherein the memory array is divided into at least four memory areas; and
the select control unit is structured to establish a first data path and a first address path between a first input/output port and a first of the at least four memory areas, to establish a second data path and a second address path between a second input/output port and a second of the at least four memory areas, to establish a third data path and a third address path between the first input/output port and a third of the at least four memory areas, and to establish a fourth data path and a fourth address path between the second input/output port and a fourth of the at least four memory areas, in response to the command signals external to the memory device,
wherein when the memory device is operating, the command signals external to the memory device are transmitted via:
at least four first signal terminals, the external command signals transmitted via at least one of the first signal terminals being structured to establish a data path and an address path between one of the four memory areas and the first input/output port; and
at least four second signal terminals, the external command signals transmitted via at least one of the second signal terminals being structured to disable a data path and an address path between one of the four memory areas and the second input/output port.

2. The device according to claim 1, wherein the select control unit operates in a normal operation mode in response to external command signals for a normal operation and operates in a test mode in response to external command signals for a test operation.

3. The method according to claim 1, wherein when the memory device is operating, the command signals external to the memory device are transmitted via at least four shared signal terminals, the external command signals transmitted via at least one of the shared signal terminals being structured to establish a data path and an address path between one of the four memory areas and both the first and second input/output ports.

4. A semiconductor memory device comprising:
first and second input/output ports;
a memory array divided into a plurality of memory areas; and
a select control unit to establish variable access paths between the memory areas and the first and second input/output ports such that each memory area is variably allocated as one of a first input/output port dedicated access area, a second input/output port dedicated access area, and a shared access area, wherein the select control unit variably allocates the memory areas directly in response to command signals external to the memory device, wherein the select control unit comprises:
a command multiplexer to generate select control signals in response to the external command signals, wherein the select control signals allocate each memory area as one of the first input/output port dedicated access area, the second input/output port dedicated access area, and the shared access area;
a data multiplexer to control data paths between the input/output ports and the memory areas in response to the select control signals; and
an address multiplexer to control address paths between the input/output ports and the memory areas in response to the select control signals;
wherein the select control unit variably allocates the memory areas;

wherein the select control unit operates in a normal operation mode in response to external command signals based on an MRS code signal for a normal operation and operates in a test mode in response to external command signals based on an MRS code signal for a test operation;

wherein when the memory device is operating, the external command signals are transmitted via:

at least four first signal terminals, the external command signals transmitted via at least one of the first signal terminals being structured to establish a data path and an address path between one of at least four memory areas and the first input/output port;

at least four second signal terminals, the external command signals transmitted via at least one of the second signal terminals being structured to disable a data path and an address path between one of the four memory areas and the second input/output port; and at least four shared signal terminals, the external command signals transmitted via at least one of the shared signal terminals being structured to establish a data path and an address path between one of the four memory areas and both the first and second input/output ports.

5. In a semiconductor memory device comprising a plurality of input/output ports and a memory array divided into a plurality of memory areas, a method for variably accessing the memory areas, comprising:

applying external command signals to allocate the memory areas for access through at least one of the input/output ports;

establishing data and address paths between the memory areas and corresponding input/output ports according to the memory area allocation;

re-applying the external command signals to re-allocate the memory areas for access through different input/output ports; and establishing new data and address paths between the memory areas and the corresponding different input/output ports according to the memory area re-allocation, wherein the external command signals are transmitted via;

at least four first signal terminals, the external command signals transmitted via at least one of the first signal terminals establishing a data path and an address path between one of at least four memory areas and the first input/output port;

at least four second signal terminals, the external command signals transmitted via at least one of the second signal terminals disabling a data path and an address path between one of the four memory areas and the second input/output port; and at least four shared signal terminals, the external command signals transmitted via at least one of the shared signals establishing a data path and an address path between one of the four memory areas and both the first and second input/output ports.

6. The method according to claim 5, wherein when the semiconductor memory device has first and second input/output ports, each memory area is variably allocated as one of a first input/output port dedicated access area, a second input/output port dedicated access area, and a shared access area.

7. The method according to claim 5, wherein each memory area is variably allocated based on an MRS code signal.

* * * * *